(12) United States Patent
Wang et al.

(10) Patent No.: US 10,317,473 B2
(45) Date of Patent: Jun. 11, 2019

(54) ELECTROCHEMICAL DEVICE POWER ESTIMATOR AND METHODS OF MAKING AND USING THE SAME

(71) Applicant: GM Global Technology Operations LLC, Detroit, MI (US)

(72) Inventors: Shuoqin Wang, Westlake, CA (US); Charles W. Wampler, Birmingham, MI (US); Mark W. Verbrugge, Troy, MI (US); Luan Vu, Midway City, CA (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 311 days.

(21) Appl. No.: 15/220,985

(22) Filed: Jul. 27, 2016

(65) Prior Publication Data

US 2018/0031638 A1    Feb. 1, 2018

(51) Int. Cl.
*G01R 31/36* (2019.01)
*G01R 31/367* (2019.01)
*G01R 31/374* (2019.01)
*G01R 35/00* (2006.01)

(52) U.S. Cl.
CPC ......... *G01R 31/367* (2019.01); *G01R 31/374* (2019.01); *G01R 31/36* (2013.01); *G01R 31/3644* (2013.01); *G01R 31/3647* (2019.01); *G01R 31/3648* (2013.01); *G01R 35/00* (2013.01); *Y02T 10/7044* (2013.01)

(58) Field of Classification Search
CPC ............ G01R 31/3651; G01R 31/3624; G01R 31/3648; B60L 11/1861; B60L 2260/44
See application file for complete search history.

(56) References Cited

U.S. PATENT DOCUMENTS

| | | | |
|---|---|---|---|
| 7,768,233 B2 | 8/2010 | Lin et al. | |
| 2011/0309838 A1 | 12/2011 | Lin et al. | |
| 2013/0218496 A1* | 8/2013 | Koch | G01R 31/3651 702/63 |
| 2015/0051853 A1* | 2/2015 | Baba | H01M 10/48 702/63 |
| 2015/0066405 A1* | 3/2015 | Li | B60L 11/1805 702/63 |
| 2016/0252585 A1* | 9/2016 | Baba | H01M 10/48 702/63 |

\* cited by examiner

*Primary Examiner* — Mischita L Henson
*Assistant Examiner* — Christine Y Liao

(57) ABSTRACT

A number of illustrative variations may include a method, which may include obtaining terminal voltage data of a electrochemical device; determining an equivalent circuit model which operates in a manner approximating the terminal voltage data comprising an open circuit voltage $V_{OC}$ comprising a constant voltage source $V_0$ and a voltage $V_s$ across a capacitor $C_s$, in series with an overpotential circuit comprising an overpotential voltage $V_1$; determining at least one of the power capabilities of the equivalent circuit model; and, estimating at least one of the power capabilities of the electrochemical device based upon the determined power capabilities of the equivalent circuit model.

19 Claims, 4 Drawing Sheets

ELECTROCHEMICAL DEVICE POWER ESTIMATOR AND METHODS OF MAKING AND USING THE SAME

TECHNICAL FIELD

The field to which the disclosure generally relates to includes electrochemical device estimators and methods of making and using the same.

BACKGROUND

Vehicles having an electrochemical device may use a electrochemical device property estimator.

SUMMARY OF SELECT ILLUSTRATIVE VARIATIONS

A number of illustrative variations may include a product comprising: a electrochemical device state estimator constructed and arranged to obtain terminal voltage data of a electrochemical device; determine an equivalent circuit model which operates in a manner approximating the terminal voltage data comprising an open circuit voltage $V_{OC}$ comprising a constant voltage source $V_0$ and a voltage $V_s$ across a capacitor $C_s$, in series with an overpotential circuit comprising an overpotential voltage $V_1$; determining at least one of the power capabilities of the equivalent circuit model; and, estimating at least one of the power capabilities of the electrochemical device based upon the determined power capabilities of the equivalent circuit model.

A number of illustrative variations may include a product comprising: a electrochemical device state estimator constructed and arranged to obtain terminal voltage data of a electrochemical device; determine an equivalent circuit model which operates in a manner approximating the terminal voltage data comprising an open circuit voltage $V_{OC}$ comprising a constant voltage source $V_0$ and a voltage $V_s$ across a capacitor $C_s$, in series with an overpotential circuit comprising an overpotential voltage $V_1$; determining at least one of the power capabilities of the equivalent circuit model; and, estimating at least one of the power capabilities of the electrochemical device based upon the determined power capabilities of the equivalent circuit model.

Other illustrative variations within the scope of the invention will become apparent from the detailed description provided hereinafter. It should be understood that the detailed description and specific examples, while disclosing variations within the scope of the invention, are intended for purposes of illustration only and are not intended to limit the scope of the invention.

BRIEF DESCRIPTION OF THE DRAWINGS

Select examples of variations within the scope of the invention will become more fully understood from the detailed description and the accompanying drawings, wherein.

DETAILED DESCRIPTION OF ILLUSTRATIVE VARIATIONS

The following description of the variations is merely illustrative in nature and is in no way intended to limit the scope of the invention, its application, or uses.

Techniques and technologies may be described herein in terms of functional and/or logical block components and various processing steps. It should be appreciated that such block components may be realized by any number of hardware, software, and/or firmware components configured to perform the specified functions. For example, an embodiment of a system or a component may employ various integrated circuit components, e.g., memory elements, digital signal processing elements, logic elements, look-up tables, or the like, which may carry out a variety of functions under the control of one or more microprocessors or other control devices. In addition, those skilled in the art will appreciate that variations may be practiced in conjunction with any number of data transmission protocols.

For the sake of brevity, conventional techniques related to hybrid and electric vehicle operation, electrochemical device operation, electrochemical device diagnostics, vehicle computing modules, and other functional aspects of the systems (and the individual operating components of the systems) may not be described in detail herein. Furthermore, the connecting lines shown in the various figures contained herein are intended to represent example functional relationships and/or physical couplings between the various elements. It should be noted that many alternative or additional functional relationships or physical connections may be present in a number of variations of the subject matter.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common mode). The description herein refers to elements or nodes or features being "connected" or "coupled" together. As used herein, unless expressly stated otherwise, "connected" means that one element/node/feature is directly joined to (or directly communicates with) another element/node/feature, and not necessarily mechanically. Likewise, unless expressly stated otherwise, "coupled" means that one element/node/feature is directly or indirectly joined to (or directly or indirectly communicates with) another element/node/feature, and not necessarily mechanically.

Figure 1:
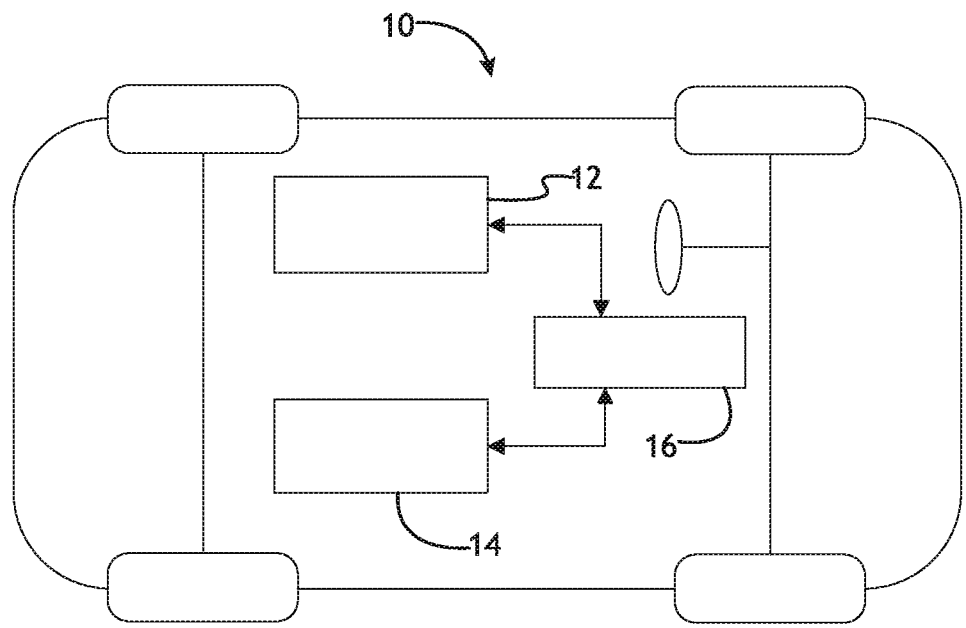
FIG. 1 illustrates a simplified plan view of a hybrid vehicle including a electrochemical device and a main power source according to a number of variations.

FIG. 1 is a simplified plan view of a product 10 according to a number of variations. In a number of variations, the product 10 may include at least one electrochemical device 12. In a number of variations, the electrochemical device may be a electrochemical device, supercapacitor, battery cells, battery packs, hybrid cells (which may include, but are not limited to, supercapacitor electrodes opposite battery electrodes and other mixtures of battery materials and supercapacitor materials, or may be another type), or may be another type. Battery materials may be defined herein as materials that undergo Faradaic (electrochemical) reactions at their surface. Supercapacitor materials may be defined herein as materials that store and release charged ions at their surface but where no Faradaic reaction takes place at their surface. In a number of variations, the product 10 may include a plurality of electrochemical devices 12. In a number of variations, the product 10 may include at least one power source 14. In a number of variations, the product 10 may include a plurality of power sources 14. In a number of variations, the product 10 may be a vehicle 10, which may be an automobile, motorcycle, spacecraft, watercraft, locomotive, or may be another type. In a number of variations, the vehicle 10 may be an electric vehicle, hybrid vehicle, such as hybrid internal combustion engine vehicles, fuel cell system vehicle, etc. In a number of variations, the electrochemical device 12 may be a lithium ion electrochemical device, nickel metal hydride (NiMH) electrochemical device, lead acid electrochemical device, lithium polymer electrochemical device or may be another type. In a number of variations, the vehicle 10 may be any electric only vehicle that only employs an electrochemical device 12 as the lone power source. In a number of variations, the product 10 may include a controller 16 that may be intended to represent all of the control modules and devices necessary for the proper operation and control of the power provided by the electrochemical device 12 and the power source 14 to drive the vehicle 10, recharge the electrochemical device 12 by the power source 14 or regenerative braking, and determine the electrochemical device state of charge (SOC) and power capability. In a number of variations, the controller 16 may obtain, derive, monitor, and/or process a set of parameters associated with electrochemical device 12. These parameters may include, without limitation: current; voltage; SOC; state of health (SOH); electrochemical device internal resistances; electrochemical device internal reactances; and power output of the electrochemical device 12. In a number of variations, the controller 16 may be an electrochemical device state estimator. In a number of variations, the product 10 or controller 16 may include an electrochemical device state estimator (BSE).

In a number of variations, the controller 16 may comprise any type of control module or vehicle controller known in the art, and can be equipped with nonvolatile memory, random access memory (RAM), discrete and analog input/output (I/O), a central processing unit, and/or communications interfaces for networking within an automotive communications network. In a number of variations the controller 16 and possibly other illustrative blocks, modules, processing logic, and circuits described in connection with the embodiments disclosed herein may be implemented or performed with a general purpose processor, a content addressable memory, a digital signal processor, an application specific integrated circuit, a field programmable gate array, any suitable programmable logic device, discrete gate or transistor logic, discrete hardware components, or any combination thereof, designed to perform the functions described herein. A processor may be realized as a microprocessor, a controller, a microcontroller, or a state machine. A processor may also be implemented as a combination of computing devices, e.g., a combination of a digital signal processor and a microprocessor, a plurality of microprocessors, one or more microprocessors in conjunction with a digital signal processor core, or any other such configuration. Moreover, the steps of a method or algorithm described in connection with the variations disclosed herein may be embodied directly in hardware, in firmware, in a software module executed by a processor, or in any practical combination thereof. In a number of variations, a software module may reside in RAM memory, flash memory, ROM memory, EPROM memory, EEPROM memory, registers, a hard disk, a removable disk, a CD-ROM, or any other form of storage medium known in the art. In this regard, an exemplary storage medium may be coupled to a processor such that the processor can read information from, and write information to, the storage medium. In a number of variations, the storage medium may be integral to the processor.

In a number of variations, the subject matter and certain aspects of the embodiments thereof may be described in the general context of computer-executable instructions, such as program modules, executed by one or more computing modules, controllers, or other devices. In a number of variations, program modules may include routines, programs, objects, components, data structures, and/or other elements that perform particular tasks or implement particular abstract data types. In a number of variations, the functionality of the program modules may be combined or distributed as desired in various variations. In a number of variations, a computing device that performs computer-executable instructions may include at least some form of computer readable media. Computer readable media may be any available media that can be accessed by a computing device and/or by applications executed by a computing device.

In a number of illustrative variations the product 10 may include any number of sensors. In a number of variations, the sensors may be may be capable of detecting one or more conditions which may include but are not limited to sound, pressure, temperature, acceleration, state of electrochemical device charge, state of electrochemical device power, current, voltage or magnetism and may be capable of producing at least one of sensor data or sensor signals and may sense and be at least one of polled or read by a control system or controller 16. In such variations the control system or controller 16 and any number of sensors may be used to obtain impedance, resistance, current, or terminal voltage data from the electrochemical device 12 at a number of temperatures and states of charge. Based at least upon obtained voltage data, an equivalent circuit model, such as a finite impulse response model circuit (FIR), $R+N(R\|C)$ model circuit or $R\|(R+C)^N$ model circuit, or may be another type, may be determined, which may operate in a manner approximating the obtained electrochemical device impedance, resistance, current, terminal voltage data, or other condition of the electrochemical device 12. In a number of variations, the equivalent circuit model may be constructed by first determining a relation of electrochemical device 12 current to equivalent circuit model voltage over a period of time, and solving for a necessary number and value of each equivalent circuit component in adherence with a predetermined current voltage relation. In a number of variations, the equivalent circuit model may be constructed by first determining a relation of electrochemical device 12 current to equivalent circuit model current over a period of time, and solving for a necessary number and value of each equivalent circuit component in adherence with a predetermined current relation. In a number of variations, the equivalent circuit model may be constructed by first determining a relation of electrochemical device 12 voltage to equivalent circuit model current over a period of time, and solving for a necessary number and value of each equivalent circuit component in adherence with a predetermined current voltage relation. In such variations, the control system or controller 16 may be used to determine at least one of the power capabilities of the equivalent circuit model by use of mathematical algorithms including, but not limited to, differential equations, domain matrix exponentials, Laplace transform(s), Fourier transform(s), Fourier series, or any method of integrating a system of ordinary differential equations. Lastly, the control system may be used to determine at least one of the power capabilities of the electrochemical device 12 based upon at least one of the determined power capabilities of the equivalent circuit model.

In a number of variations, the SOC of the electrochemical device 12 may be dynamically tracked to determine when to charge the electrochemical device 12. The controller 16 may be suitably configured to control the SOC between 0% to 100%. Accurate knowledge of internal electrochemical device parameters may be important for purposes of controlling the electrochemical device systems of hybrid electric (and purely electric) vehicles. The methodology described herein adaptively extracts at least one internal parameters for electrochemical devices 12. The advantages of the proposed methodology over existing techniques are better adaptation to variations in the environment, electrochemical device state, and driving conditions, higher computational efficiency, and lower implementation cost including but not limited to, more accurate power prediction models for better power management in the electrochemical device 12 and the product 10 through the controller 16. In a number of variations, this new methodology may provide better power prediction for better power management in an electrochemical device 12 which may benefit range, performance and life of the electrochemical device 12.

To better control the electrochemical devices 12, controllers 16 may determine and process electrochemical devices 12 parameters such as, but not limited to, open-circuit voltage ($V_{OC}$), ohmic resistance, terminal voltage, terminal current, the electrochemical device capacitance, or may be another condition or parameter. For non-limiting example, the $V_{OC}$ may be used to estimate the electrochemical device state of charge (SOC), which is an index associated with electrochemical device condition. In a number of variations, electrochemical device 12 terminal voltage and current may be used to estimate $V_{OC}$ and other electrochemical device internal parameters that may not be directly measurable during operation.

In a number of variations, a controller 16 (see FIG. 1) may be suitably configured to determine the SOC and other electrochemical device 12 parameters for the product, based upon dynamic measurable parameters, namely, the measured voltage V, the measured current I, and the measured temperature T. In a number of variations, an equivalent circuit model may be derived in the form of an equation or set of equations that directly relates the electrochemical device 12 internal parameters to the electrochemical device terminal voltage and current and can be monitored and changed through real time change in the voltage, current, temperature, or may be a different variable. In a number of variations, the equivalent circuit model may be an equivalent circuit model. An adaptive mathematical algorithm based on this model may then be utilized to extract electrochemical device 12 internal parameters from measured values of the electrochemical device 12 terminal voltage, temperature, and current. The methodology described herein adaptively estimates more electrochemical device 12 variables in real time with less reliance on predetermined lookup tables for better adaptation to the environment and driving conditions, and to achieve high computational efficiency as well as low implementation cost.

In a number of illustrative variations, voltage data for any value of voltage in the methodology discussed herein may be processed in real time using any number of linear regression methods which may include but are not limited to the use of a Kalman filter, weighted recursive least squares (WRLS) analysis, or any other method known in the art. In such variations, the equivalent circuit model may be constructed to operate in a manner approximating the processed data.

In a number of illustrative variations, the electrochemical device 12 yielding the processed data upon which the equivalent circuit model is based may have voltage and current limits. In such variations, for the sake of avoiding damage to the electrochemical device 12, power predictions for the electrochemical device 12 may be made by holding the equivalent circuit model current at an extreme constant value and determining whether the resultant circuit voltage will remain within the voltage limits of the electrochemical device 12. If it is determined that the circuit voltage will remain within the voltage limits of the electrochemical device 12, a current-limited power may be predicted for the electrochemical device 12 based on the extreme constant current. If, it is determined that the circuit voltage will not remain within the voltage limits of the electrochemical device 12, then the circuit voltage may be held at an extreme constant value within the electrochemical device 12 voltage limits, and the current corresponding to the extreme constant voltage may then be determined. A voltage-limited power may then be predicted for the electrochemical device 12 based on the extreme circuit voltage.

In a number of illustrative variations, the current or voltage of the system may held at a constant extreme, and a mathematical algorithm comprising at least one of a numerical integration of a differential equation system, Fourier series, a Fourier transform, Laplace transform, a closed-form expression for a FIR circuit model, a closed-form expression for a R+N(R∥C) model circuit or R∥(R+C)$^N$ model may be used in conjunction with a predetermined current voltage relationship of the equivalent circuit model to solve for the electrochemical device 12 power at time t.

Figure 2A:
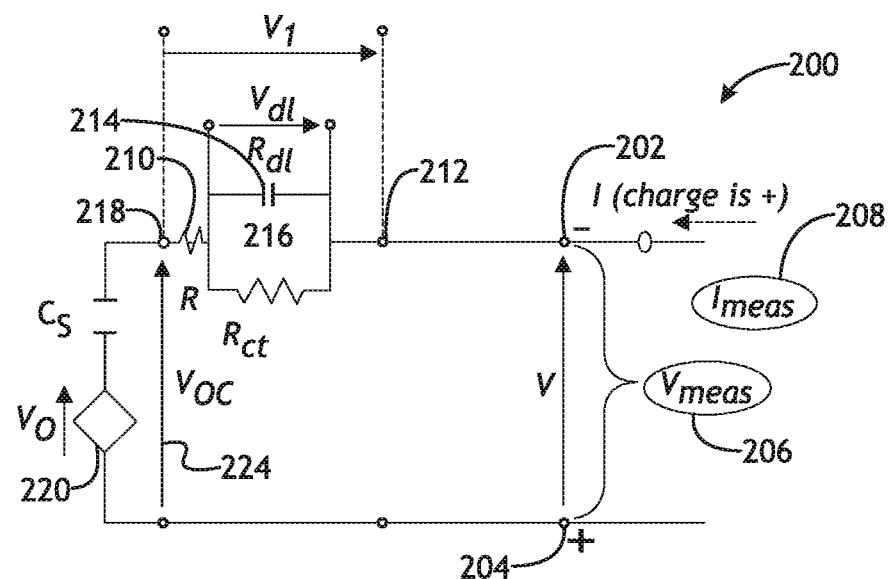
FIG. 2A illustrates a schematic diagram of an equivalent circuit model according to a number of variations.
Figure 2B:
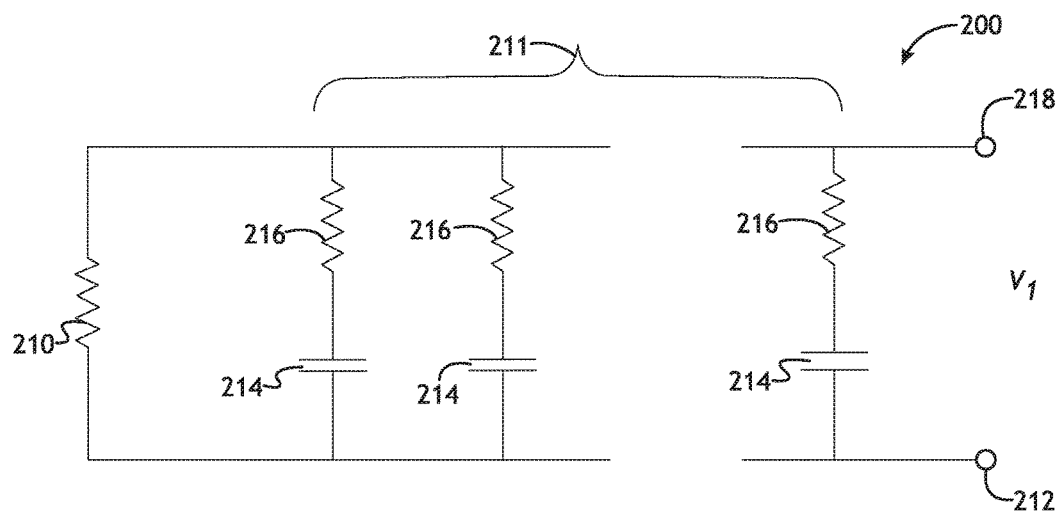
FIG. 2B illustrates a schematic diagram of a two RC-pair partial equivalent circuit model according to a number of variations.

FIG. 2A illustrates a diagram of an equivalent circuit model 200 used to model an electrochemical device 12, such as a lithium ion electrochemical device. In a number of variations, the equivalent circuit model 200 has a first node 202 and a second node 204, with a voltage (V) existing between the nodes. A voltage measuring means 206, such as a voltmeter, can be disposed between the first node 202 and the second node 204 to obtain a reading of the measured voltage V. An electric current measuring device 208 is adapted to measure an electric current at first node 202. For this embodiment, current flowing into the first node 202 represents a positive charging current for equivalent circuit model 200. The dashed arrow in FIG. 2A represents this positive charging current.

In a number of variations, the equivalent circuit model 200 also includes a series resistance 210 disposed between a third node 212 and a fourth node 218. The series resistance 210 is labeled R in FIG. 2A. In a number of variations a capacitance 214 and a parallel resistance 216 may be disposed between third node 212 and the fourth node 218. Capacitance 214 represents the internal double layer capacitance of the electrochemical device model. Accordingly, capacitance 214 is labeled $C_{dl}$ in FIG. 2A. Resistance 216 represents the charge transfer resistance of the electrochemical device model—accordingly, resistance 216 is labeled $R_{ct}$ in FIG. 2A. The voltage across capacitance 214 and resistance 216 is referred to as the double layer voltage, $V_{dl}$. Notably, $V_{dl}$ is an internal voltage that cannot be measured in a practical electrochemical device. Another way to term $V_{dl}$ is the overpotential $V_1$, which is an internal reading of voltage between the third 212 and fourth 218 nodes. In a number of variations, the circuit between the third 212 and fourth 218 nodes may be an overpotential circuit 265. In a number of variations, the overpotential circuit 265 may include at least one resistor 216. In a number of variations, the overpotential circuit 265 may include at least one capacitor 214. In a number of variations, the overpotential circuit 265 may be a linear circuit. In a number of variations, the overpotential circuit 265 may be a non-linear circuit.

In a number of variations, the equivalent circuit model 200 may also include an electrochemical device voltage source or open circuit voltage source 220 (labeled $V_0$) disposed between the fourth node 218 and the second node 204. In a number of variations, the equivalent circuit model 200 may also include a capacitor $C_s$ disposed between the fourth node 218 and the second node 2014. In a number of variations, the capacitor $C_s$ may have zero initial voltage and include its contribution to terminal voltage as current flows through the electrochemical device. In a number of variations, $C_s$ may depend on SOC at the start of a pulse or may get its value from a look-up table for the $V_{OC}$. An open circuit voltage 224 (labeled $V_{OC}$) is defined between fourth node 218 and second node 204. Referring to FIG. 1, in a product 10, the $V_{OC}$ would represent the open terminal voltage of electrochemical device 12, which cannot be measured under normal operating conditions because electrochemical device is connected to the electrical systems of the product or vehicle 100. In a number of variations, the capacitor $C_s$ may be function of temperature and $V_{OC}$.

In a number of variations, the measurable or terminal voltage V in FIG. 2A at time t can be represented by the relationship shown in equation 1 below where the open circuit voltage $V_{OC}$ is an addition of the open circuit voltage source $V_0$ and $V_s$, $V_s$ being the voltage across the inserted capacitor $C_s$, and is included in $V_1$ and in equation 2, power can be calculated based on a constant value of open circuit voltage.

$$V(t) = V_{OC} + V_1(t) \text{ where } V_{OC} = V_0 + V_s(t) \quad (1)$$

$$\text{Power}(t) = I(t)(V_{OC} + V_1(t)) \quad (2)$$

In a number of variations, the controller 16 may continually estimate $V_{oc}$ and the parameters of $V_1$ from the observations of terminal voltage and current time history. In a number of variations, the open circuit voltage $V_{oc}$ can be modeled as a source of constant voltage $V_0$ in series with a capacitor $C_s$ in equation 3 below where $Q(t) = \int_{t_0}^{t} I(\tau) d\tau$ is the time-integral of current in the circuit, beginning at time $t_0$, at which time the estimate $V_0(t_0)$ was last updated where Q is the total charge capacity of the capacitor $C_s$:

$$V_{OC}(t) = V_0(t_0) + Q(t)/C_s \quad (3)$$

In a number of variations the voltage $V_s$ across the capacitor $C_S$ may be modeled by the differential equation shown in equation 4.

$$\frac{d}{dt} V_s = \frac{1}{C_s} I(t), V_s(0) = 0 \quad (4)$$

Figure 3A:
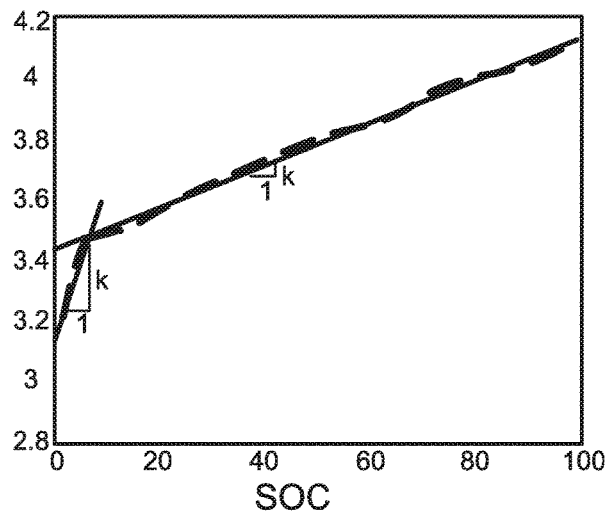
FIG. 3A illustrates a pair of open circuit voltage v. state of charge graphs according to a number of variations.

In a number of variations, the voltage $V_s$ across the capacitor $C_S$ may be dependent on temperature T. In a number of variations, the voltage $V_s$ across the capacitor $C_S$ may be determined for a number of different temperatures and modeled according to equation 4 below based on the different values of T, which can be determined via look-up tables. In a number of variations, the value of $C_s$ derives from the slope of $$\frac{\partial V_0}{\partial SOC}$$

at a current temperature T, however, this may change with varying temperature. FIG. 3C shows a non-limiting example of these changes. In a number of variations, the value of $C_s$ may be derived from a look-up table stored in the controller 16. In a number of variations, look-up tables may be stored in the controller 16 and regressed and calculated in real time. Referring back to FIG. 3, the change in $V_{OC}$ can be modeled under equation 5 below for values of SOC near any initial value, for example $SOC(0) = SOC_0$:

$$V_0(SOC(t)) = V_0(SOC_0) + k(SOC(t) - SOC_0) \quad (5)$$

In equation 5, $$k = \frac{\partial V_0(SOC_0)}{\partial SOC}$$

where SOC is the state of charge of the electrochemical device 12 and $$C_s = \frac{Q_T}{k}$$

where $Q_T$ is the total charge capacity of the electrochemical device 12. State of Charge can be defined according to equation 6 below where $Q_a$, is the total charge on the anode, and $Q_T$ is the total charge that the electrochemical device 12 accepts as the anode goes from empty to full. SOC may be regressed in real time based on look-up tables from measured parameters monitored by the controller 16.

$$SOC(t) = \frac{Q_a(t)}{Q_T} = \frac{\int_{t_0}^{t} I(\tau) d\tau}{Q_T} \quad (6)$$

where it is assumed that the anode is empty at time $t_0$.

In a number of variations, power according to equation 2 may be estimated or determined in two cases: 1) where a constant extreme value of current I(t) could be found; or 2) where a constant extreme value of voltage V(t) could be found and a mathematical algorithm would solve for power as a function of time t along with finding overpotential voltage $V_1(t)$.

Under case 1), when current is constant $I(t) = I_0$, then the equation for voltage across the capacitor $V_s$ can be written in equation 7 below.

$$V_s = \frac{t I_0}{C_s} \quad (7)$$

In a number of variations, under case 1), it is necessary to solve for $V_1(t)$ in equation 1 with the constant current value $I_0$, and known initial conditions for $V_0$, $C_s$, and $I_0$. This may be done via a mathematical algorithm. In a number of variations, the mathematical algorithm may include one of: (A) using a numerical method to approximately solve the governing differential equations to obtain the approximate time evolution of the overpotential $V_1(t)$, (B) using a Laplace transform of the overpotential circuit voltage to formulate an equation for the time evolution of the overpotential $V_1(t)$, (C) using a matrix exponential of the overpotential circuit voltage to formulate an equation for the time evolution of the overpotential $V_1(t)$, (D) using a closed form expression for a FIR circuit model of the overpotential circuit voltage to formulate an equation for the time evolution of the overpotential $V_1(t)$, (E) using a closed form expression for a circuit model of the overpotential circuit voltage to formulate an equation for the time evolution of the overpotential $V_1(t)$.

For cases (A), (B), and (C) these may be known techniques known in the art. In a number of variations, for case (A), the equivalent circuit model 200 can be linear or non-linear, and it may be solved using well-known numerical integration methods such as but not limited to the Runge-Kutta method, the Adams-Bashforth method, the Euler method or may be another method.

Figure 3B:
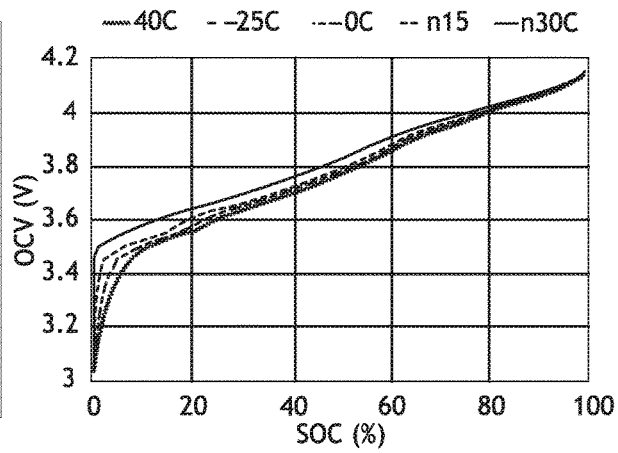
FIG. 3B illustrates a graph and table of open circuit voltage versus state of charge accounting for temperature according to a number of variations.

In a number of variations for cases (A), (B), and (C), the capacitor $C_s$ may have zero initial voltage and may depend on the state of charge (SOC) at the start of the pulse. In a number of variations, this can be determined from a look-up table for the $V_{OC}$ curve. An example $V_{OC}$ curve vs. SOC is shown in FIG. 3. In a number of variations, for a constant $C_s$ and a linear model for $V_1$, one can calculate the power P in the form of a calculation for power as shown below in equation 8 as the power pulse is linear.

$$\text{Power}(t) = \left(V_0 + \frac{Q(t)}{C_s} + V_1(t)\right)I_0 \qquad (8)$$

$$\text{where } Q(t) = \int_o^t I(t)dt = I_0 t$$

In a number of variations, for a non-constant $C_s$ and/or a non-linear model for $V_1$, one can calculate the power P using ordinary differential equation system as shown in equations 9

$$\frac{d}{dt}V = f(V, I, T; \Phi), V_1 = g(V), V = (v_1, \ldots, v_N) \qquad (9)$$

$$\text{Power}(t) = \left(V_0 + \frac{Q}{C_s} + V_1(t)\right)$$

where V is a vector of state variables, $f$ is a vector-valued function, g is a scalar valued function, and $\Phi$ represents the parameters, e.g., resistance and capacitance values, of the model. The exact form of the functions $f$ and g depends on which equivalent circuit model employed.

In a number of variations, this model may be incorporated to show $V_{OC}$ in Equation (1). In a number of variations, $C_s$ may be a function of temperature where the value of $C_s$ may be found from the slope of the $V_{OC}$ curve interpolated from a look up table. In a number of variations, the look-up table may be used internally in the controller 16. In a number of variations, the look-up table may be measured experimentally in the electrochemical device 12 and stored for use in the controller 16. In a number of variations, the constant voltage $V_0$ and the parameters of overpotential $V_1$ may be regressed in real time using the controller 16. In a number of variations, $V_1$ can be modeled with a method given the kinetics of the model. In a number of variations, this case will provide a showing of $V_1(t)$.

In a number of variations, the inclusion of the capacitor $C_s$ may better predict power by accounting for changes in open-circuit voltage during a power pulse. This model of the open-circuit voltage may be combined with different modeling methods used in electrochemical device 12 controllers 16 for the overpotential $V_1$ to determine the overall power given equation (1) including, but not limited to, finite impulse response (FIR)(pulse at 1, 2 or 10 seconds by non-limiting example), R+N(R||C), R+C+N(R||C), or may be another type. In a number of variations, in the case of a R+N(R||C) circuit model, the new circuit model becomes a $C_s$+R+N(R||C) circuit model, which is naturally in R+(N+1)(R||C) form wherein the new $C_s$ element can be considered as an R||C pair with R=∞. In a number of variations, in a FIR estimate circuit, the power of charge and discharge can be sustained by assuming $V_{OC}$ stays constant during the power pulse. For longer power pulses, enough charge may be passed in or out of the electrochemical device 12 so that $V_{OC}$ moves to a substantially new value during the pulse. In a number of variations, this movement is greater for operation in regions where the $V_{OC}$ curve is steeper, as determined by look up tables. In a number of variations, equation (3) above can better model the change in $V_{OC}$ value as the linear approximation of the $V_{OC}$ around the initial $V_{OC}$ value which shows linear relation to the capacitor $C_s$ circuit element. In a number of variations, if the modeling method for overpotential $V_1$ is linear then the overall (C+(FIR), C+R+N(R||C), C+R||(R+C)$^N$, C+ Any Linear RC circuit) including the capacitance is linear, and then the state of power can be calculated using closed-form formulas.

In a number of variations, when the ODE model of the overpotential is linear, as it will be for any equivalent circuit model that is a combination of linear resistors and capacitors, the compound circuit built by inserting the capacitor $C_s$ in series with the overpotential circuit remains linear. Because it is linear, this compound circuit can be solved using (B) Laplace transform methods or (C) matrix exponentials. These techniques are well known to those schooled in the art, so we do not further elaborate here.

Figure 4:
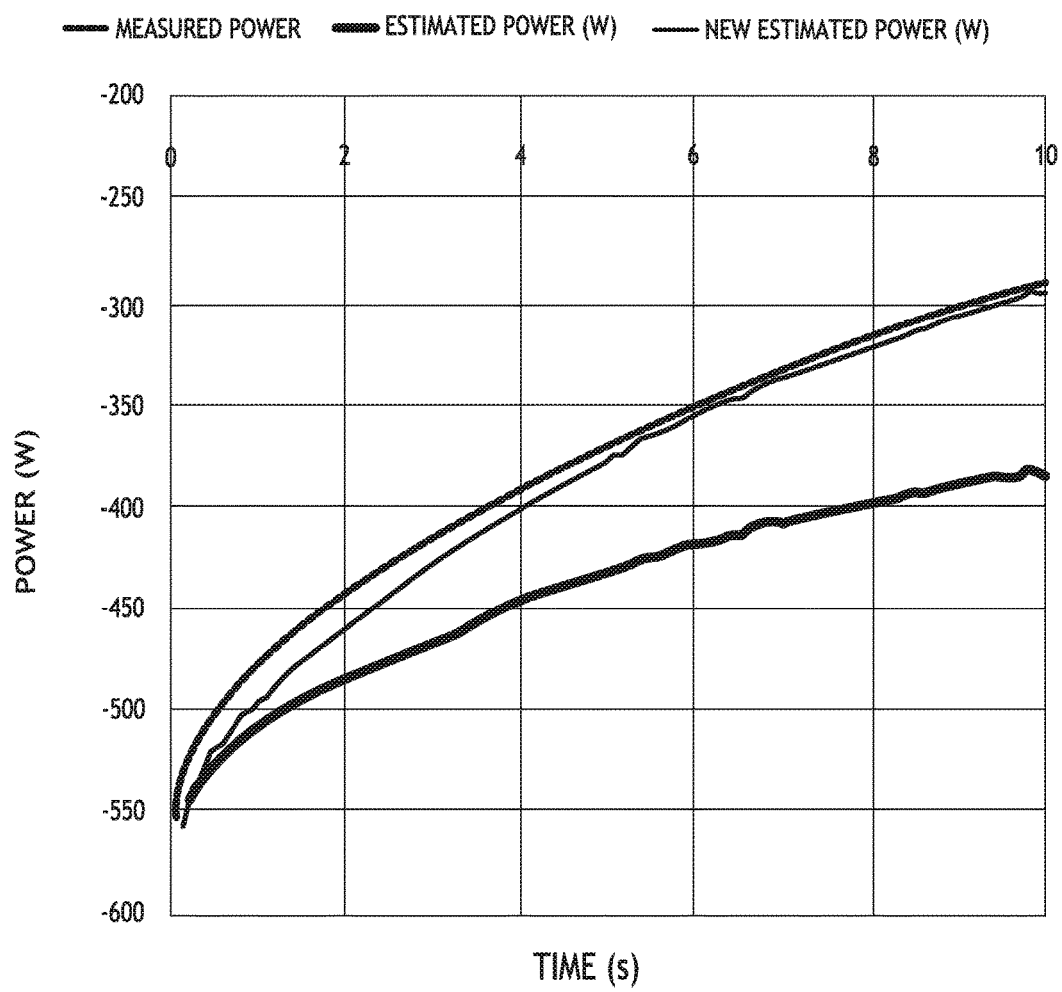
FIG. 4 illustrates a graph of power versus time according to a number of variations.

For case (D), in a number of variations, $V_1$ can be modeled in a FIR model where V1 is calculated from equation 8 below. FIG. 4 illustrates the improvement in estimating power (W) as a function of time (s) and the improved measurement method using FIR for measuring power in an electrochemical device 12 using a controller 16 according to these methods. In a number of variations, the FIR model is for an R||(R+C)$^N$ equivalent circuit model, with corresponding equation 10 below where.

$$\text{Power}(t) = \left(V_0 + \frac{Q(t)}{C_s} + V_1(t)\right)I_0 \qquad (10)$$

$$\text{with } Q(t) = \int_0^t I(t)dt$$

where $V_0(SOC(t))=V_0(SOC_0)+k(SOC(t)-SOC(0))$ where $$k = \frac{\partial V_0}{\partial SOC}$$

and where SOC is the state of charge of the electrochemical device and $$C_s = \frac{Q}{k}$$

where Q is the total state of charge of the electrochemical device wherein the overpotential $V_1$ is determined via equation 11 below:

$$V_1(t) = \Sigma_{n=0}^{L} H_n I_0(t - n\Delta t) \quad (11)$$

wherein the currents values $I(t-n\Delta t)$ before t=0 are preceding measured values, the current values after t=0 are constant and equal to the above mentioned constant input current, $\Delta t$ is the sampling period, and wherein $\{H(n\Delta t); n=0, 1, \ldots L\}$ are the coefficients of the FIR filter, $\{H(n\Delta t)\}$ can also be viewed as a digitized impulse response.

In a number of variations, in the case of an FIR model, the solution when current is held at a constant value takes a simple form which may be advantageous for implementation.

Figure 2C:
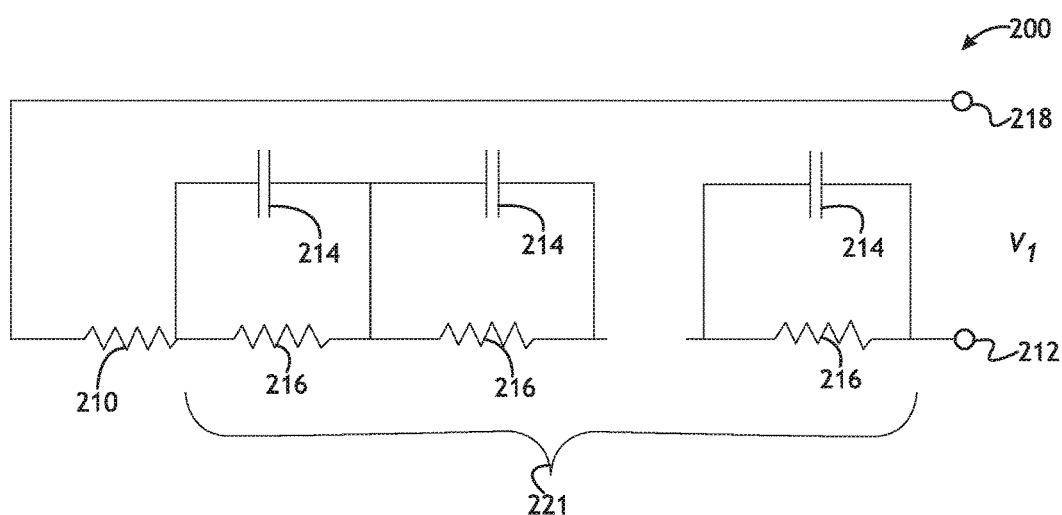
FIG. 2C illustrates a schematic diagram of a two RC-pair partial equivalent circuit model according to a number of variations.

For case (E), in a number of illustrative variations, and as illustrated by FIG. 2C, the equivalent circuit model may be constructed to operate in a manner approximating the processed data consists of a resistor 210 in series with any number of R‖C pairs 221. Each of the R‖C pairs consists of a resistor 216 in parallel with a capacitor 214. It is understood that the values of the resistors and capacitors in 221 are not expected to be equal. In a number of illustrative variations, the necessary number and value of each equivalent circuit component may be determined by a real-time state estimator.

In a number of illustrative variations, for the purpose of determining the power capabilities of an R+N(R‖C) circuit, it may be assumed that input current, I is held constant at an extreme (allowable, insofar as the device 12 is not damaged) value, say $I_0$, for a chosen interval, t seconds. In such variations, assuming N R‖C pairs, voltage across capacitor i, $C_i$ at time, t may be solved for according to equation 12 below $$v_i(t) = v_i(0) \exp\left(\frac{-t}{R_i C_i}\right) + I_0 R_i \left(1 - \exp\left(\frac{-t}{R_i C_i}\right)\right) \quad (12)$$

and power at time, t may be predicted according to equation 13

$$\text{Power}(t) = I_0\left(V_0 + \frac{I_0 t}{C_s} + R + v_1(t) + \ldots + v_N(t)\right) \quad (13)$$

In a number of variations, once one has an equation for $V_1(t)$ has been determined via the cases (A)-(E) above, power can be calculated from equation 14 below:

$$P(t) = I_0\left(V_0 + \frac{tI_0}{C_s} + V(t)\right) \quad (14)$$

In a number of variations, for case (2), where a constant extreme value of voltage V(t) could be found and a mathematical algorithm would solve for power as a function of time t, then voltage is held constant at $V_{const} = V_0 + V_s + V_1$, however, neither $V_s$ nor $V_1$ is constant and current now varies with time I(t). Therefore, in a number of variations, the capacitor $C_s$ is considered in series with the overpotential circuit 265 and modified into a modified overpotential circuit 267. The power calculation is now shown in equation 15 below:

$$P(t) = V_{const} I(t) \quad (15)$$

In a number of variations, it is necessary to solve for I(t) in equation (15) with the constant current value $V_{const}$. This may be done via a mathematical algorithm. In a number of variations, the mathematical algorithm may include one of: (A) using a numerical integration of an ordinary differential equation system for the combined circuit where it may be linear or non-linear for the time evolution of the current I(t), (B) using a Laplace transform of the circuit voltage to formulate an equation for the time evolution of the current I(t), (C) using a matrix exponential of the circuit voltage to formulate an equation for the time evolution of the current I(t), or (D) using a closed form expression for a FIR circuit model of the circuit voltage to formulate an equation for the time evolution of the overpotential $V_1(t)$.

For cases (A), (B), and (C) these may be known techniques known in the art. In a number of variations, for case (A), the equivalent circuit model 200 can be linear or non-linear.

In a number of variations, one can calculate the power P using ordinary differential equation system, which in a general form is as shown in equations 16 below.

$$\frac{d}{dt}V = f(V, I, T; \Phi), V_{const} = g(V, I), V = (v_1, \ldots, v_N) \quad (16)$$

$$\text{Power}(t) = V_{const} I(t)$$

where V is a vector of state variables, $f$ is a vector-valued function, g is a scalar valued function, and t represents the parameters, e.g., resistance and capacitance values, of the model. The exact form of the functions $f$ and g depends on which equivalent circuit model employed. To solve system (7) in the most general case, one recognizes that $V_{const} = g(V, I)$ is an algebraic equation and therefore known numerical techniques for solving differential-algebraic equations (that is, a DAE solver) can be employed.

In a less general case, I appears in g(V,I) in such a way that the relationship can be inverted to find $I = h(V_{const}, V)$. That is, $h(V_{const}, V)$ is a function such that $V_{const} = g(V, h(V_{const}, V))$ holds true identically for all possible values of $V_{const}$ and the vector V. In such a case, I can be eliminated from the DAE system (7) to obtain the ODE system with equation 17.

$$\frac{d}{dt}V = f(V, h(V_{const}, V), T; \Phi) \quad (17)$$

which can then be solved using a numerical method for ODE systems such as but not limited to the Runge-Kutta method, the Adams-Bashforth method, and the Euler method. Once V(t) has been so obtained, the power is evaluated as shown in equation 18 below.

$$P(t) = V_{const} h(V_{const}, V(t)) \quad (18)$$

Furthermore, when in (7) the functions $f(V,I,T; \Phi)$ and $g(V,I)$ are linear in V and I, then general methods for solving linear ODE system, such as the Laplace transform technique or matrix exponentials, can be applied to evaluate V(t) and I(t), so that power can be evaluated as $P(t)=V_{const}I(t)$. As these techniques are well known to those schooled in the art, we do not further elaborate here.

For case (D), in a number of variations, $V_1$ can be modeled in a FIR model where V1 is calculated from equation 8 below. FIG. 4 illustrates the improvement in estimating power (W) as a function of time (s) and the improved measurement method using FIR for measuring power in an electrochemical device 12 using a controller 16 according to these methods. In a number of variations, the FIR model is for an $R\|(R+C)^N$ equivalent circuit model, with corresponding equation 19 below where.

$$\text{Power}(t) = \left(V_0 + \frac{Q(t)}{C_s} + V_1(t)\right) I \text{ with} \quad (19)$$

$$Q(t) = \int_0^t I(t)dt \text{ where}$$

$$V_0(SOC(t)) = V_0(SOC_0) + k(SOC(t) - SOC(0))$$

where $$k = \frac{\partial V_0}{\partial SOC}$$

and where SOC is the state of charge of the electrochemical device and $$C_s = \frac{Q}{k}$$

where Q is the total state of charge of the electrochemical device wherein the overpotential $V_1$ is determined via equation 20 below $$V_1(t) = \Sigma_{n=0}^{L} H_n I(t-n\Delta t) \quad (20)$$

wherein the currents values $I(t-n\Delta t)$ before t 32 0 are preceding measured values, the current values after t 32 0 are constant and equal to the above mentioned constant input current, $\Delta t$ is the sampling period, and wherein $\{H(n\Delta t); n=0, 1, \ldots L\}$ are the coefficients of the FIR filter, $\{H(n\Delta t)\}$ can also be viewed as a digitized impulse response.

A number of variations may include a method including using a state of power predictor comprising an equivalent which may be modeled based on terminal voltage from an electrochemical device 12 such as but not limited to a electrochemical device, supercapacitor or other electrochemical device and processing the runtime values of that model circuit using any number of known real-time linear regression algorithms including, but not limited, to a weighted recursive least squares (WRLS), Kalman filter or other means. In a number of variations, the constant voltage $V_0$ and the parameters of overpotential $V_1$ may be regressed in real time using the controller 16 using these methods. The method may also include a controller 16 constructed and arranged to receive input from the state of power predictor, compare the input from the predictor with predetermined values and take action such as send a signal representative of the predicted state of power or take other action when the input from the predictor is within a predetermined range of the predetermined values. In a number of variations the controller 16 may be constructed and arranged to prevent a particular usage of an electrochemical device based upon the state of power prediction. In a number of variations, the controller may be constructed and arranged to use at least a segment of voltage-based electrochemical device power capability estimation data, and using real-time linear regression, which may be used as a method of estimating future behavior of a system based on current and previous data points, to provide a robust state of power predictor. Linear regression may be performed by forming an RC circuit which may be equivalent to electrochemical impedance spectroscopy data and processing the runtime values of that RC circuit using any number of known real-time linear regression algorithms which may include, but are not limited to, a weighted recursive least squares (WRLS) algorithm, Kalman filter algorithm or other means. In a number of variations the controller 16 and any number of sensors may be used to obtain impedance data from a electrochemical device at a number of electrochemical device temperatures and electrochemical device states of charge; building an equivalent $R+N(R\|C)$ or $R\|(R+C)^N$ circuit which operates in a manner approximating the obtained voltage data; determining at least one of the power capabilities of the equivalent circuit model by use of domain matrix exponentials, a Laplace transform, a Fourier transform, a Fourier series, or any other method of integrating a system of ordinary differential equations; and, estimating at least one of the power capabilities of the electrochemical device based upon at least one of the determined power capabilities of the equivalent circuit model.

The following description of variants is only illustrative of components, elements, acts, products and methods considered to be within the scope of the invention and are not in any way intended to limit such scope by what is specifically disclosed or not expressly set forth. The components, elements, acts, products and methods as described herein may be combined and rearranged other than as expressly described herein and still are considered to be within the scope of the invention.

Variation 1 may include a method comprising: obtaining terminal voltage data of a electrochemical device; determining an equivalent circuit model which operates in a manner approximating the terminal voltage data comprising an open circuit voltage $V_{OC}$ comprising a constant voltage source $V_0$ and a voltage $V_s$ across a capacitor $C_s$, in series with an overpotential circuit comprising an overpotential voltage $V_1$; determining at least one of the power capabilities of the equivalent circuit model; and, estimating at least one of the power capabilities of the electrochemical device based upon the determined power capabilities of the equivalent circuit model.

Variation 2 may include a method as set forth in variation 1 wherein the terminal voltage is obtained at a number of temperatures and modeled as a function of temperature within the equivalent circuit model.

Variation 3 may include a method as set forth in variations 1-2 wherein the value of the voltage $V_s$ across the inserted capacitor $C_s$ is a function of temperature and modeled as a function of temperature within the equivalent circuit model and where $$C_s = \frac{Q_T}{k}$$

where $Q_T$ is the total capacity of the electrochemical device, $$k = \frac{\partial V_0}{\partial SOC}$$

and SOC is the state of charge of the electrochemical device.

Variation 4 may include a method as set forth in variations 1 wherein the open circuit constant voltage $V_0$ and overpotential $V_1$ are regressed in real time.

Variation 5 may include a method as set forth in variations 1-4 wherein the overpotential circuit model is a linear circuit.

Variation 6 may include a method as set forth in variations 1-4 wherein the overpotential circuit is a non-linear circuit.

Variation 7 may include a method as set forth in variations 1-6 wherein the overpotential circuit comprises at least one capacitor.

Variation 8 may include a method as set forth in variations 1-7 wherein the overpotential circuit comprises at least one resistor.

Variation 9 may include a method as set forth in variations 1-8 wherein estimating at least one of the power capabilities of the electrochemical device based upon the power capabilities of the equivalent circuit comprises:

imposing a constant input current, $I_0$ upon the equivalent circuit model;

solving for the overpotential voltage, $V_1(t)$ according to $V(t)=V(0)+V_s+V_1(t)$, where $$V_s = \frac{tI_0}{C_s}$$

and initial conditions $V(0)$, and $C_s$ are known, and solving for $V_1(t)$ through a mathematical algorithm;

predicting an equivalent circuit model power at time, t according to $$\text{Power}(t) = I_0 V(t) = I_0 \left( V(0) + \frac{tI_0}{C_s} + V_1(t) \right);$$

and, correlating the equivalent circuit model power at time, t to the power of the electrochemical device at time t where $V_0(SOC(t))=V_0(SOC_0)+k(SOC(t)-SOC(0))$ where $$k = \frac{\partial V_0}{\partial SOC}$$

and where SOC is the state of charge of the electrochemical device.

Variation 10 may include a method as set forth in variations 1-8 wherein estimating at least one of the power capabilities of the electrochemical device based upon the power capabilities of the equivalent circuit comprises:

imposing a an extreme constant input voltage, V upon the equivalent circuit model such that $V=(V_0+V_s+V_1)$;

solving for an equivalent circuit model current at time t by assuming a constant overpotential for the equivalent circuit model through a mathematical algorithm;

predicting for an equivalent circuit model power at time t via the equation:

Power(t)=VI(t); and, correlating the equivalent circuit model power at time, t to the power of the electrochemical device at time t where $V_0(SOC(t))=V_0(SOC_0)+k(SOC(t)-SOC(0))$ where $$k = \frac{\partial V_0}{\partial SOC}$$

and where SOC is the state of charge of the electrochemical device.

Variation 11 may include a method as set forth in variation 9 wherein the mathematical algorithm comprises using a numerical integration of the ordinary differential equation of the overpotential circuit voltage to formulate an equation for the time evolution of the overpotential $V_1(t)$.

Variation 12 may include a method as set forth in variation 9 wherein the mathematical algorithm comprises using a Laplace transform of the overpotential circuit voltage to formulate an equation for the time evolution of the overpotential $V_1(t)$.

Variation 13 may include a method as set forth in variations 9 wherein the mathematical algorithm comprises using a matrix exponential of the overpotential circuit voltage to formulate an equation for the time evolution of the overpotential $V_1(t)$.

Variation 14 may include a method as set forth in variation 9 wherein the mathematical algorithm comprises using a close form expression for a FIR circuit model of the overpotential circuit voltage to formulate an equation for the time evolution of the overpotential $V_1(t)$.

Variation 15 may include a method as set forth in variation 9 wherein the mathematical algorithm comprises using a close form expression for a R+N(R||C) circuit model of the overpotential circuit voltage to formulate an equation for the time evolution of the overpotential $V_1(t)$.

Variation 16 may include a method as set forth in variation 10 wherein the mathematical algorithm comprises using a numerical integration of the ordinary differential equation of the overpotential circuit current to formulate an equation for the time evolution of the current overpotential I(t).

Variation 17 may include a method as set forth in variation 10 wherein the mathematical algorithm comprises using a Laplace transform of the overpotential circuit current to formulate an equation for the time evolution of the overpotential current I(t).

Variation 18 may include a method as set forth in variation 10 wherein the mathematical algorithm comprises using a matrix exponential of the overpotential circuit current to formulate an equation for the time evolution of the overpotential I(t).

Variation 19 may include a method as set forth in variation 10 wherein the mathematical algorithm comprises using a close form expression for a FIR circuit model of the overpotential circuit current to formulate an equation for the time evolution of the overpotential I(t).

Variation 20 may include product comprising: a electrochemical device state estimator constructed and arranged to obtain terminal voltage data of a electrochemical device; determine an equivalent circuit model which operates in a manner approximating the terminal voltage data comprising an open circuit voltage $V_{OC}$ comprising a constant voltage source $V_0$ and a voltage $V_s$ across a capacitor $C_s$, in series with an overpotential circuit comprising an overpotential voltage $V_1$; determining at least one of the power capabilities of the equivalent circuit model; and, estimating at least one of the power capabilities of the electrochemical device based upon the determined power capabilities of the equivalent circuit model.

The above description of select variations within the scope of the invention is merely illustrative in nature and, thus, variations or variants thereof are not to be regarded as a departure from the spirit and scope of the invention.

What is claimed is:

1. A method comprising:
   using any number of sensors to obtain data regarding a terminal voltage of an electrochemical device;
   using a controller to determine an equivalent circuit model which operates in a manner approximating the data regarding the terminal voltage comprising an open circuit voltage $V_{OC}$ comprising a constant voltage source $V_0$ and a voltage $V_s$ across a capacitor $C_S$, in series with an overpotential circuit comprising an overpotential voltage $V_1$;
   using the controller to determine at least one of the power capabilities of the equivalent circuit model;
   using the controller to estimate at least one of the power capabilities of the electrochemical device based upon the determined power capabilities of the equivalent circuit model; and
   using the controller to send a signal representative of at least one of the power capabilities of the electrochemical device to a component of a vehicle;
   wherein using the controller to estimate at least one of the power capabilities of the electrochemical device based upon the power capabilities of the equivalent circuit model comprises:
      imposing a constant input current, $I_0$ upon the equivalent circuit model;
      using the controller to solve for the overpotential voltage, $V_1(t)$ according to $V(t)=V(0)+V_s+V_1(t)$, where $$V_s = \frac{tI_0}{C_s}$$

and initial conditions $V(0)$, and $C_s$ are known,
   and to solve for $V_1(t)$ through a mathematical algorithm;
   using the controller to predict an equivalent circuit model power at time, t according to $$\text{Power}(t) = I_0 V(t) = I_0 \left( V(0) + \frac{tI_0}{C_s} + V_1(t) \right);$$

and,
   using the controller to correlate the equivalent circuit model power at time, t to the power of the electrochemical device at time t where $V_0(SOC(t))=V_0(SOC_0)+k(SOC(t)-SOC(0))$ where $$k = \frac{\partial V_0}{\partial SOC}$$

and where SOC is the state of charge of the electrochemical device.

2. A method as set forth in claim 1 wherein the terminal voltage is obtained at a number of temperatures and modeled as a function of temperature within the equivalent circuit model.

3. A method as set forth in claim 1 wherein the value of the voltage $V_s$ across the inserted capacitor $C_S$ is a function of temperature and modeled as a function of temperature within the equivalent circuit model and where $$C_s = \frac{Q_T}{k}$$

where $Q_T$ is the total capacity of the electrochemical device, $$k = \frac{\partial V_0}{\partial SOC}$$

and SOC is the state of charge of the electrochemical device.

4. A method as set forth in claim 1 wherein the open circuit constant voltage $V_0$, voltage $V_s$ across the inserted capacitor $C_S$, and overpotential voltage $V_1$ are regressed in real time.

5. A method as set forth in claim 1 wherein the overpotential circuit model is a linear circuit.

6. A method as set forth in claim 1 wherein the overpotential circuit is a non-linear circuit.

7. A method as set forth in claim 1 wherein the overpotential circuit comprises at least one capacitor.

8. A method as set forth in claim 1 wherein the overpotential circuit comprises at least one resistor.

9. A method as set forth in claim 1 wherein the mathematical algorithm comprises using a numerical integration of the ordinary differential equation of the overpotential circuit voltage to formulate an equation for the time evolution of the overpotential $V_1(t)$.

10. A method as set forth in claim 1 wherein the mathematical algorithm comprises using a Laplace transform of the overpotential circuit voltage to formulate an equation for the time evolution of the overpotential $V_1(t)$.

11. A method as set forth in claim 1 wherein the mathematical algorithm comprises using a matrix exponential of the overpotential circuit voltage to formulate an equation for the time evolution of the overpotential $V_1(t)$.

12. A method as set forth in claim 1 wherein the mathematical algorithm comprises using a close form expression for a FIR circuit model of the overpotential circuit voltage to formulate an equation for the time evolution of the overpotential $V_1(t)$.

13. A method as set forth in claim 1 wherein the mathematical algorithm comprises using a close form expression for a R+N(R∥C) circuit model of the overpotential circuit voltage to formulate an equation for the time evolution of the overpotential $V_1(t)$.

14. A method comprising:
   using any number of sensors to obtain data regarding a terminal voltage of a electrochemical device;
   using the controller to determine an equivalent circuit model which operates in a manner approximating the data regarding the terminal voltage comprising an open circuit voltage $V_{OC}$ comprising a constant voltage source $V_0$ and a voltage $V_s$ across a capacitor $C_S$, in series with an overpotential circuit comprising an overpotential voltage $V_1$;

using the controller to determine at least one of the power capabilities of the equivalent circuit model; and, using the controller to estimate at least one of the power capabilities of the electrochemical device based upon the determined power capabilities of the equivalent circuit model; and using the controller to send a signal representative of at least one of the power capabilities of the electrochemical device to a component of a vehicle;

wherein using the controller to estimate at least one of the power capabilities of the electrochemical device based upon the power capabilities of the equivalent circuit model comprises:

imposing an extreme constant input voltage, V upon the equivalent circuit model such that $V=(V_0+V_S+V_1)$;

using the controller to solve for an equivalent circuit model current at time t by assuming a constant overpotential for the equivalent circuit model through a mathematical algorithm;

using the controller to predict for an equivalent circuit model power at time t via the equation:

Power(t)=$VI(t)$; and, using the controller to correlate the equivalent circuit model power at time, t to the power of the electrochemical device at time t where $V_0(SOC(t))=V_0(SOC_0)+k(SOC(t)-SOC(0))$ where $$k = \frac{\partial V_0}{\partial SOC}$$

and where SOC is the state of charge of the electrochemical device.

15. A method as set forth in claim 14 wherein the mathematical algorithm comprises using a numerical integration of the ordinary differential equation of the overpotential circuit current to formulate an equation for the time evolution of the current overpotential I(t).

16. A method as set forth in claim 14 wherein the mathematical algorithm comprises using a Laplace transform of the overpotential circuit current to formulate an equation for the time evolution of the overpotential current I(t).

17. A method as set forth in claim 14 wherein the mathematical algorithm comprises using a matrix exponential of the overpotential circuit current to formulate an equation for the time evolution of the overpotential I(t).

18. A method as set forth in claim 14 wherein the mathematical algorithm comprises using a close form expression for a FIR circuit model of the overpotential circuit current to formulate an equation for the time evolution of the overpotential I(t).

19. A product comprising: a electrochemical device state estimator constructed and arranged to obtain terminal voltage data of a electrochemical device; determine an equivalent circuit model which operates in a manner approximating the terminal voltage data comprising an open circuit voltage $V_{OC}$ comprising a constant voltage source $V_0$ and a voltage $V_s$ across a capacitor $C_S$, in series with an overpotential circuit comprising an overpotential voltage $V_1$; determining at least one of the power capabilities of the equivalent circuit model; and, estimating at least one of the power capabilities of the electrochemical device based upon the determined power capabilities of the equivalent circuit model wherein estimating at least one of the power capabilities of the electrochemical device based upon the power capabilities of the equivalent circuit model comprises:

imposing a constant input current, $I_0$ upon the equivalent circuit model;

solving for the overpotential voltage, $V_1(t)$ according to $V(t)=V(0)+V_S+V_1(t)$, where $$V_s = \frac{tI_0}{C_s}$$

and initial conditions V(0), and $C_s$ are known, and to solve for $V_1(t)$ through a mathematical algorithm;

predicting an equivalent circuit model power at time, t according to $$\text{Power}(t) = I_0 V(t) = I_0\left(V(0) + \frac{tI_0}{C_s} + V_1(t)\right);$$

and, correlating the equivalent circuit model power at time, t to the power of the electrochemical device at time t where $V_0(SOC(t))=V_0(SOC_0)+k(SOC(t)-SOC(0))$ where $$k = \frac{\partial V_0}{\partial SOC}$$

and where SOC is the state of charge of the electrochemical device.

* * * * *